United States Patent
Choi et al.

(10) Patent No.: US 9,730,318 B2
(45) Date of Patent: Aug. 8, 2017

(54) ROLLABLE DISPLAY DEVICE, METHOD OF MANUFACTURING THE SAME, AND FLEXIBLE DISPLAY DEVICE

(71) Applicant: SAMSUNG DISPLAY CO., LTD., Yongin, Gyeonggi-Do (KR)

(72) Inventors: Kyungmin Choi, Seoul (KR); Youn Joon Kim, Seoul (KR); Sangjo Lee, Hwaseong-si (KR); Junghun Lee, Hwaseong-si (KR); Jusuck Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 14/701,442

(22) Filed: Apr. 30, 2015

(65) Prior Publication Data
US 2016/0120023 A1    Apr. 28, 2016

(30) Foreign Application Priority Data

Oct. 22, 2014    (KR) .................. 10-2014-0143459

(51) Int. Cl.
*H05K 1/00*    (2006.01)
*H05K 1/02*    (2006.01)
(Continued)

(52) U.S. Cl.
CPC ....... *H05K 1/028* (2013.01); *G02F 1/133305* (2013.01); *G06F 1/1652* (2013.01);
(Continued)

(58) Field of Classification Search
CPC .......... G09F 11/29; G09F 21/04; G09F 21/06; G09F 9/30; G09F 9/301; G09F 9/33
See application file for complete search history.

(56) References Cited

U.S. PATENT DOCUMENTS 6,498,597 B1 * 12/2002 Sawano ................. G09F 11/29
                                                345/107
8,446,549 B2    5/2013 Huitema et al.
(Continued)

FOREIGN PATENT DOCUMENTS

JP    2008-500593 A    1/2008
KR    10-2007-0057911 A    6/2007
(Continued)

OTHER PUBLICATIONS

Korean Patent Abstracts Publication No. KR 10-2008-0091145 A, dated Oct. 9, 2008, for KR 10-1301918 B1, 1 page.
(Continued)

*Primary Examiner* — Yuriy Semenenko
(74) *Attorney, Agent, or Firm* — Lewis Roca Rothgerber Christie LLP

(57) ABSTRACT

A rollable display device includes a flexible display panel, a housing, a grip part, and a connection part. The flexible display panel is configured to display an image. The flexible display panel is rolled and kept inside the housing. The grip part extends the flexible display panel from the housing to expose the flexible display panel to the outside of the housing. The connection part is between the flexible display panel and the grip part to connect the flexible display panel and the grip part. The connection part is not configured to display the image.

29 Claims, 14 Drawing Sheets

(51) Int. Cl.
*G02F 1/1333* (2006.01)
*G06F 1/16* (2006.01)
*H05K 1/18* (2006.01)
*H05K 5/00* (2006.01)
*H05K 5/02* (2006.01)

(52) U.S. Cl.
CPC ........... *H05K 1/181* (2013.01); *H05K 5/0017* (2013.01); *H05K 5/0217* (2013.01); *G02F 2201/50* (2013.01); *H05K 2201/10128* (2013.01)

(56) References Cited

U.S. PATENT DOCUMENTS

| | | |
|---|---|---|
| 2004/0183958 A1 | 9/2004 | Akiyama et al. |
| 2007/0216639 A1* | 9/2007 | LaFarre ................ G02F 1/167 345/107 |
| 2008/0212271 A1 | 9/2008 | Misawa |
| 2009/0233265 A1* | 9/2009 | Budryk .................... B43L 1/00 434/412 |
| 2010/0033435 A1 | 2/2010 | Huitema |
| 2012/0050075 A1* | 3/2012 | Salmon ................ G06F 1/1626 341/20 |
| 2012/0075252 A1* | 3/2012 | Dighde .................... G09F 9/30 345/175 |

FOREIGN PATENT DOCUMENTS

| | | |
|---|---|---|
| KR | 10-0818170 B1 | 4/2008 |
| KR | 10-2012-0014872 A | 2/2012 |
| KR | 10-2012-0133201 A | 12/2012 |
| KR | 10-1301918 B1 | 8/2013 |
| KR | 10-2014-0028216 A | 3/2014 |

OTHER PUBLICATIONS

EPO Search Report dated Mar. 7, 2016, corresponding to European Patent application 15191087.4, (9 pages).

* cited by examiner

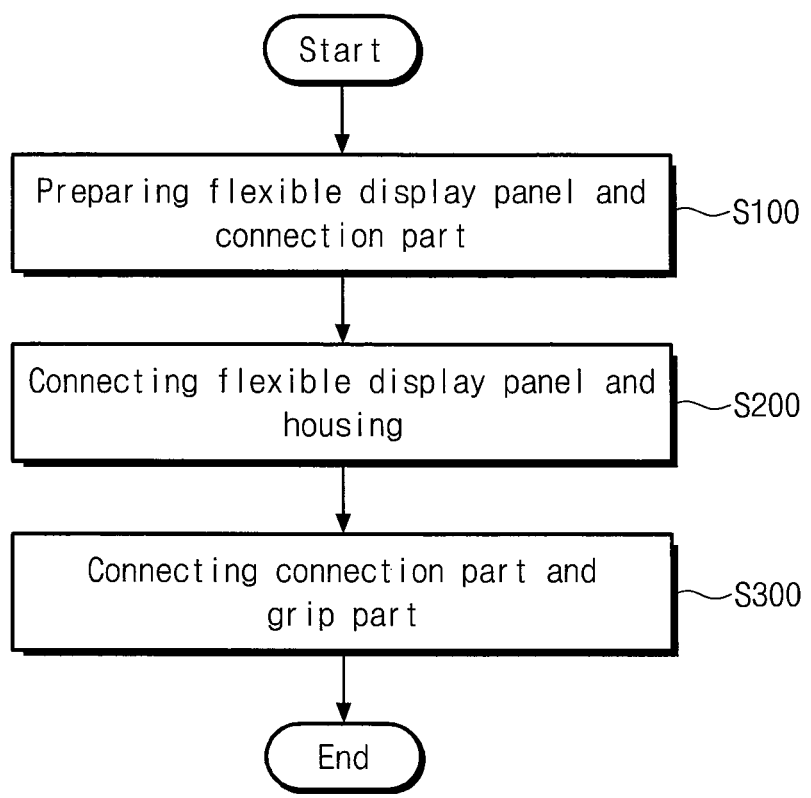

ROLLABLE DISPLAY DEVICE, METHOD OF MANUFACTURING THE SAME, AND FLEXIBLE DISPLAY DEVICE

CROSS-REFERENCE TO RELATED APPLICATION

This patent application claims priority to and the benefit of Korean Patent Application No. 10-2014-0143459, filed on Oct. 22, 2014, the contents of which are hereby incorporated by reference in its entirety.

BACKGROUND

1. Field

The present disclosure relates to a rollable display device, a method of manufacturing the same, and a flexible display device.

2. Description of the Related Art

As the market demand for flexible display devices continues to increase, various flexible display devices, such as a curved display device having a specific curvature, a foldable display device having a specific radius of curvature or bent with respect to a folding axis, a rollable display device rolled to a specific radius of curvature, etc., have been developed.

The rollable display device has advantages such as a wide display area and superior transportability.

SUMMARY

The present disclosure includes a rollable display device capable of improving a display quality.

The present disclosure includes a method of manufacturing the rollable display device.

The present disclosure includes a flexible display device.

One or more embodiments of the present disclosure include a rollable display device including a flexible display panel, a housing, a grip part, and a connection part. The flexible display panel is configured to display an image. The flexible display panel is rolled and kept inside the housing. The grip part extends the flexible display panel from the housing upon application of an external force to expose the flexible display panel to an outside of the housing. The connection part is between the flexible display panel and the grip part to connect the flexible display panel and the grip part. The connection part is not configured to display the image.

The flexible display panel and the grip part are spaced apart from each other in a first direction. The flexible display panel includes a base substrate and an image display part on the base substrate to display the image.

The connection part includes a connection film connected to at least a portion of the base substrate and the image display part.

The connection film has a thickness equal to a sum of a thickness of the base substrate and a thickness of the image display part.

At least one of the base substrate and the connection film includes at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

The connection part includes a connection base substrate extending from the base substrate in the first direction.

The flexible display panel further includes a polarization film on the image display part. The connection part includes a connection polarization film extending from the polarization film in the first direction.

The flexible display panel further includes an upper protective film on the polarization film. The connection part further includes a connection upper protective film on the connection polarization film and extending from the upper protective film in the first direction.

The flexible display panel further includes a lower protective film under the base substrate. The connection part includes a connection lower protective film extending from the lower protective film in the first direction.

The grip part includes an upper grip part and a lower grip part. The upper grip part is on the connection part and overlaps with at least a portion of the connection part. The lower grip part is under the connection part and overlaps with at least a portion of the connection part.

The grip part further includes a side surface grip part that covers one side surface of the connection part and is connected to the upper grip part and the lower grip part.

The rollable display device further includes a fixing screw. The fixing screw connects the upper grip part and the lower grip part and fixes the upper grip part to the lower grip part.

A thickness of the connection part is different from a thickness of the flexible display panel.

The thickness of the connection part is smaller than the thickness of the flexible display panel.

A number of layers included in the connection part is smaller than a number of layers included in the flexible display panel.

One or more embodiments of the present disclosure provide a method of manufacturing a rollable display device, including a step of preparing a flexible display panel configured to display an image and a connection part that is not configured to display an image and is connected to the flexible display panel, a step of connecting the flexible display panel to a housing, and a step of connecting the connection part to a grip part.

The step of preparing the flexible display panel and the connection part includes preparing a base substrate and disposing an image display part on the base substrate. The image display part is configured to display the image.

The flexible display panel includes the base substrate and the image display part. The step of preparing the flexible display panel and the connection part includes preparing a connection film and attaching the connection film to the base substrate and the image display part.

The step of preparing the base substrate includes preparing a base substrate and preparing a connection base substrate extending from the base substrate in a first direction. The step of connecting the connection part and the grip part includes connecting the connection base substrate to the grip part. The flexible display panel includes the base substrate and the image display part, and the connection part includes the connection base substrate.

The step of preparing the flexible display panel and the connection part further includes preparing a polarization film, preparing a connection polarization film extending from the polarization film in a first direction, and disposing the polarization film on the image display part. The step of connecting the connection part to the grip part includes connecting the connection polarization film to the grip part. The flexible display panel includes the base substrate, the image display part, and the polarization film, and the connection part includes the connection polarization film.

The step of preparing the flexible display panel and the connection part further includes preparing an upper protective film, preparing a connection upper protective film extending from the upper protective film in a first direction, and disposing the upper protective film on the polarization film. The step of connecting the connection part to the grip part includes connecting the connection upper protective film to the grip part. The flexible display panel includes the base substrate, the image display part, the polarization film, and the upper protective film, and the connection part includes the connection polarization film and the connection upper protective film.

The step of preparing the flexible display panel and the connection part further includes preparing a lower protective film, preparing a connection lower protective film extending from the lower protective film in a first direction, and disposing the base substrate on the lower protective film. The step of connecting the connection part to the grip part includes connecting the connection lower protective film to the grip part. The flexible display panel includes the lower protective film, the base substrate, and the image display part, and the connection part includes the connection lower protective film.

A thickness of the connection part is different from a thickness of the flexible display panel.

The thickness of the connection part is smaller than the thickness of the flexible display panel.

A number of layers included in the connection part is smaller than a number of layers included in the flexible display panel.

In one or more embodiments of the present disclosure, a rollable display device includes a flexible display panel, a housing, a grip part, and a connection part. The flexible display panel includes a display area configured to display an image and a non-display area that is not configured to display the image. The housing contains the flexible display panel when it is rolled inside the housing. Upon application of an external force, the grip part extends the flexible display panel out from the housing to expose the flexible display panel to an outside of the housing. The connection part is disposed between the flexible display panel and the grip part to connect the flexible display panel and the grip part.

A thickness of the connection part is different from a thickness of the flexible display panel.

The thickness of the connection part is smaller than the thickness of the flexible display panel.

A number of layers included in the connection part is smaller than a number of layers included in the flexible display panel.

One or more embodiments of the present disclosure include a flexible display device including a flexible display panel and a connection part. The flexible display panel is configured to display an image. The connection part is connected to the flexible display panel. The connection part is not configured to display the image and the connection part has a thickness smaller than a thickness of the flexible display panel.

The flexible display panel includes a base substrate, an image display part, and a polarization film. The image display part is configured to display an image and is on the base substrate. The polarization film is on the image display part, and the connection part includes a connection polarization film extending from the polarization film.

The flexible display panel further includes an upper protective film on the polarization film. The connection part further includes a connection upper protective film on the connection polarization film and extending from the upper protective film.

The flexible display panel includes a lower protective film, a base substrate, and an image display part. The base substrate is on the lower protective film. The image display part is on the base substrate to display the image. The connection part includes a connection lower protective film extending from the lower protective film.

The rollable display device may provide improved display quality.

The rollable display device having improved display quality may be manufactured by the manufacturing method according to the above.

The flexible display device may have improved display quality.

BRIEF DESCRIPTION OF THE DRAWINGS

The above and other advantages of the present disclosure will become readily apparent by reference to the following detailed description when considered in conjunction with the accompanying drawings wherein:

FIG. 5 is a flowchart showing a method of manufacturing a rollable display device according to one or more embodiments of the present disclosure;

DETAILED DESCRIPTION

Figure 1A:
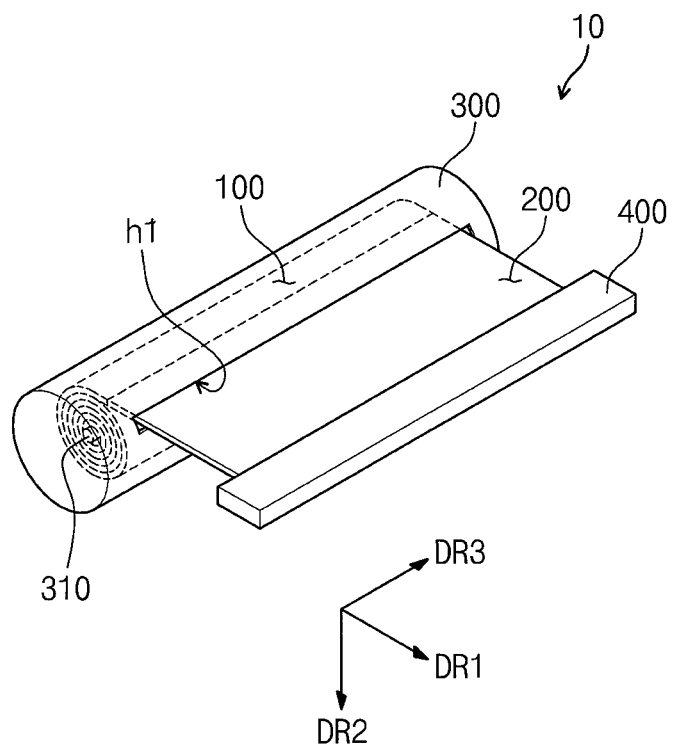
FIGS. 1A and 1B are perspective views showing a rollable display device according to one or more embodiments of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
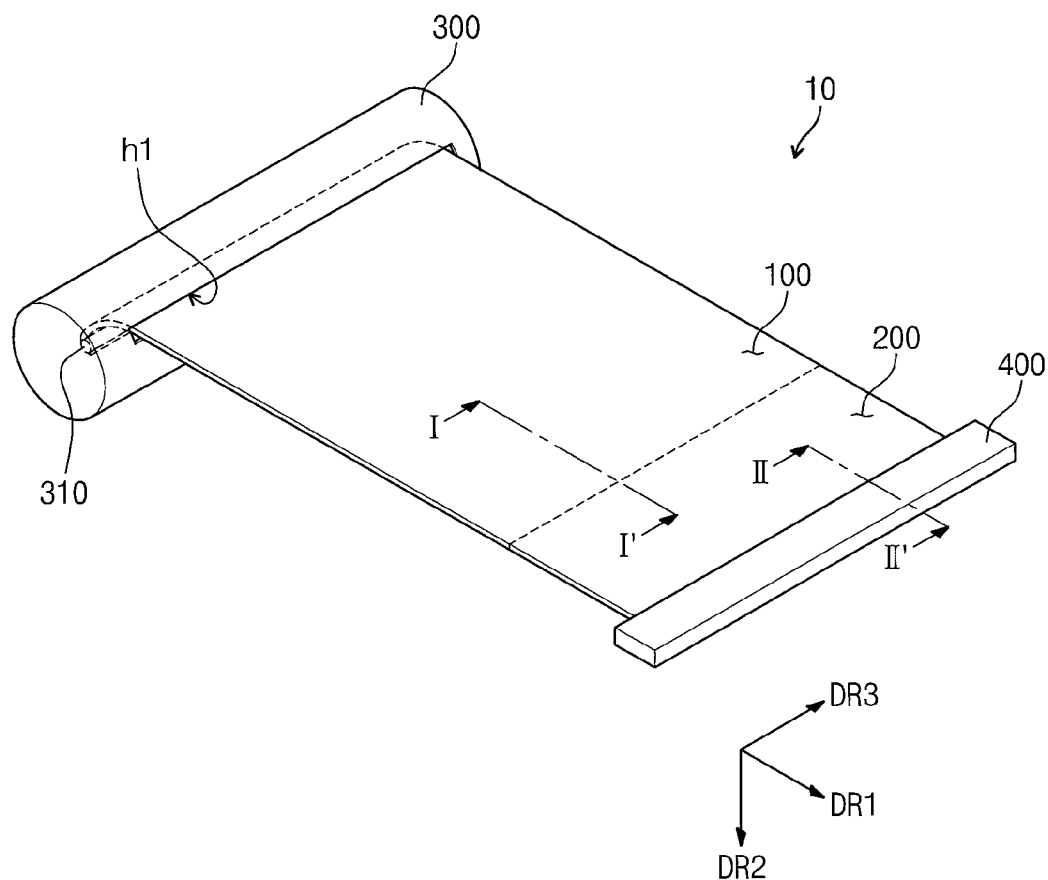

FIGS. 1A and 1B are perspective views showing a rollable display device 10 according to one or more embodiments of the present disclosure.

Figure 2:
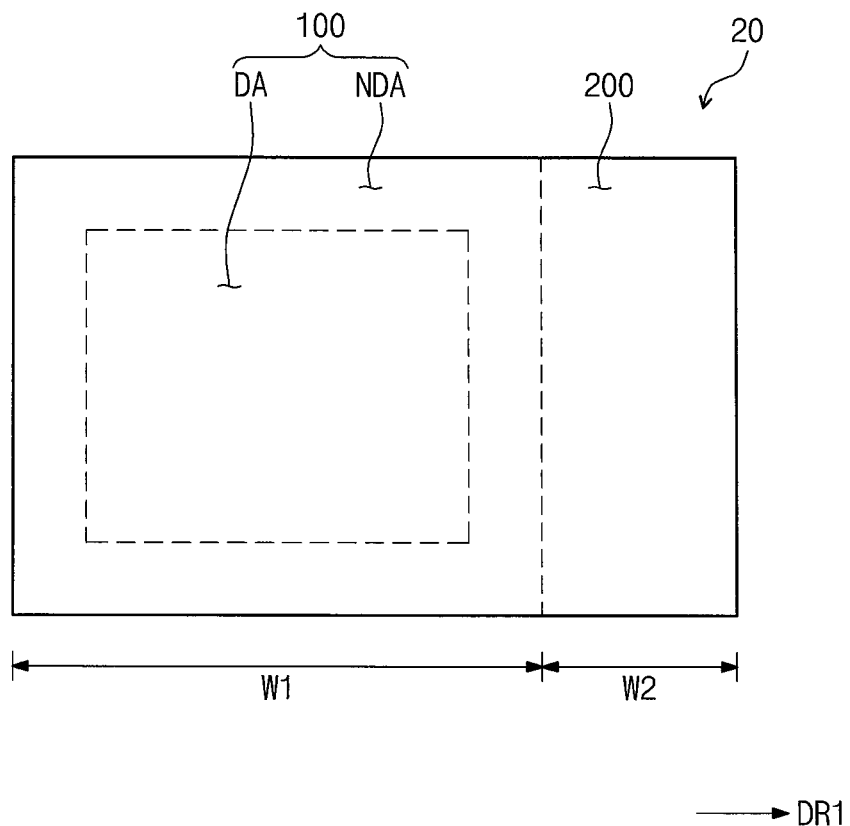
FIG. 2 is a plan view showing a flexible display panel and a connection part, which are included in a rollable display device according to one or more embodiments of the present disclosure.

Referring to FIGS. 1A, 1B and 2, the rollable display device 10 includes a flexible display device 20, a housing 300, and a grip part 400. The flexible display device 20 includes a flexible display panel 100 and a connection part 200. The flexible display panel 100 displays an image. As illustrated in FIG. 1A, the flexible display panel 100 is rolled and kept inside the housing 300. As illustrated in FIG. 1B, the grip part 400 may be used to extend the flexible display panel 100 from the housing 300.

FIG. 2 is a plan view showing the flexible display panel 100 and the connection part 200, which are included in the rollable display device 10 according to one or more embodiments of the present disclosure.

Referring to FIGS. 1A, 1B, and 2, the flexible display panel 100 includes a display area DA and a non-display area NDA. The non-display area NDA surrounds the display area DA. The display area DA may have a substantially rectangular shape when viewed from a thickness direction DR2 (hereinafter, referred to as a second direction) of the flexible display panel 100, but the shape of the display area DA is not limited thereto.

The image is displayed in the display area DA. A plurality of pixels are arranged in the display area DA to form the image. Each pixel includes at least one thin film transistor.

The image is not displayed in the non-display area NDA. A driving part is disposed in the non-display area NDA. The driving part is electrically connected to the pixels to apply signals to the pixels. The driving part includes a data driver that converts an image signal to a data signal and applies the data signal to the flexible display panel 100 and a gate driver that applies a gate signal to the flexible display panel 100. At least one of the data driver and the gate driver may be manufactured in the form of chip, and then mounted on a tape carrier package or a printed circuit board.

The connection part 200 is disposed between the flexible display panel 100 and the grip part 400 to connect the flexible display panel 100 and the grip part 400. The image is not displayed in the connection part 200. The connection part 200 is connected to one end of the flexible display panel 100. The connection part 200 is connected to the flexible display panel 100 and disposed adjacent to the flexible display panel 100 in a first direction DR1.

When viewed from the second direction DR2, the flexible display panel 100 may have a substantially rectangular shape 100, but the shape of the flexible display panel 100 is not limited thereto.

When viewed from the second direction DR2, a width W1 of the flexible display panel 100 (in the first direction DR1) is greater than a width W2 of the connection part 200 (in the first direction DR1). When the width W1 of the flexible display panel 100 is greater than the width W2 of the connection part 200, the area of the flexible display panel 100 (which displays the image) is greater than the area of the connection part 200.

The flexible display panel 100 includes a flexible substrate. The flexible display panel 100 is rolled or stretched with respect to at least one rolling axis in the housing 300. The flexible display panel 100 may be exposed to the outside of the housing 300 by an external force applied thereto. For example, upon application of an external force, the flexible display panel 100, which is rolled and kept inside the housing 300, may be exposed to the outside of the housing 300 after passing through an opening h1 in the housing 300.

The housing 300 accommodates the flexible display panel 100. As shown in FIGS. 1A and 1B, the housing 300 may have a substantially cylindrical shape, but the shape of the housing 300 should not be limited thereto as long as the flexible display panel 100 may be rolled and kept in the housing 300. In addition, the housing 300 may be formed as a singular, i.e., individual, unit as shown in FIGS. 1A and 1B, but it is not limited thereto. For example, the housing 300 may be manufactured by assembling two or more sub-housings with each other.

The housing 300 includes a reel core 310 on which the flexible display panel 100 is rolled with respect to the rolling axis. The rolling axis is substantially parallel to a third direction DR3 that is substantially perpendicular to each of the first and second directions DR1 and DR2. The reel core 310 has a substantially cylindrical shape that is elongated along the rolling axis.

The flexible display panel 100 and the connection part 200 are rolled and kept inside the housing 300. In some embodiments, the flexible display panel 100 is connected to the reel core 310 disposed in the housing 300, and then rolled or stretched. As shown in FIGS. 1A and 1B, the flexible display panel 100 may be rolled around the reel core 310, but it is not limited thereto. For example, the reel core 310 may include a coupling recess and the flexible display panel 100 may be coupled to the coupling recess.

Further, the reel core 310 may be formed as a singular, i.e., individual, unit as shown in FIGS. 1A and 1B, but it is not limited thereto. For example, the reel core 310 may be manufactured by assembling two or more sub-reel cores with each other.

FIGS. 3A to 3E are cross-sectional views take along a line I-I' of FIG. 1.

Figure 3A:
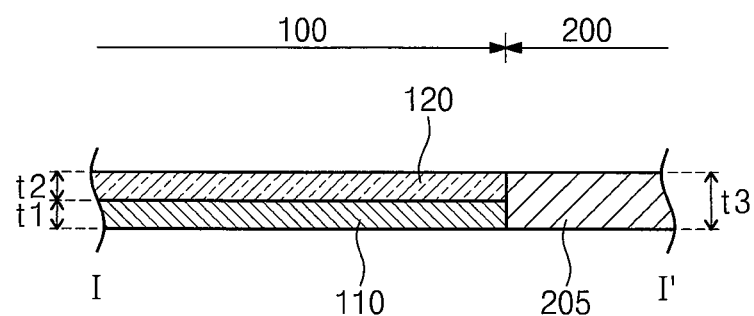
FIGS. 3A to 3E are cross-sectional views take along a line I-I' of FIG. 1B.

Referring to FIGS. 1A, 1B, and 3A, the flexible display panel 100 includes a base substrate 110 and an image display part 120.

The base substrate 110 may be, but is not limited to, a transparent insulating substrate. The base substrate 110 includes at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

When viewed from the second direction DR2, the base substrate 110 may have a substantially rectangular shape, but the shape of the base substrate 110 is not limited thereto.

The image display part 120 is disposed on the base substrate 110 and displays the image. When viewed from the second direction DR2, the image display part 120 may have a substantially rectangular shape, but the shape of the image display part 120 is not limited thereto.

The image display part 120 emits a light or controls a light incident thereto. The image display part 120 may be one of an electrophoretic display device, an electrowetting display device, and an organic light emitting display device, which may be used in the rollable display device 10. Hereinafter, the organic light emitting display device will be described as the image display part 120.

In one or more embodiments, the image display part 120 includes an anode electrode, an organic light emitting layer, and a cathode electrode. Holes and electrons injected into the organic light emitting layer from the anode and cathode electrodes, respectively, are recombined in the organic light emitting layer to generate excitons, and the image display part 120 emits the light by the excitons that return to a ground state from an excited state.

The rollable display device 10 may further include a connection film 205. The connection film 205 is connected to at least a portion of the base substrate 110 and the image display part 120. In one or more embodiments, the connection film 205 is connected to at least the portion of the base substrate 110 and the image display part 120 by using an adhesive. In FIG. 2, the connection film 205 is connected to each of the base substrate 110 and the image display part 120, but it is not limited thereto. For example, the connection film 205 may be connected to the base substrate 110 but not to the image display part 120, or may be connected to the image display part 120 but not to the base substrate 110. The connection film 205 may be connected to an entire side surface of the base substrate 110 or a portion of the side surface of the base substrate 110. In addition, the connection film 205 may be connected to an entire side surface of the image display part 120 or a portion of the side surface of the image display part 120.

The flexible display panel 100 includes the base substrate 110 and the image display part 120 disposed on the base substrate 110. The connection part 200 includes the connection film 205 connected to at least the portion of the base substrate 110 and the image display part 120.

The connection film 205 may have a thickness t3 equal to a sum of a thickness t1 of the base substrate 110 and a thickness t2 of the image display part 120, but the thickness t3 is not limited thereto. For example, the thickness t3 of the connection film 205 may be greater than or less than the sum of the thickness t1 of the base substrate 110 and the thickness t2 of the image display part 120.

The connection film 205 includes at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

Referring to FIGS. 1A, 1B, and 3B to 3E, the thickness of the flexible display panel 100 may be different from the thickness of the connection part 200.

Figure 3B:
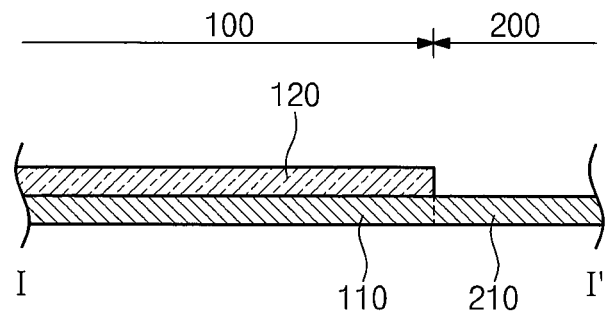

Referring to FIGS. 1A, 1B, and 3B, the flexible display panel 100 includes a base substrate 110 and an image display part 120. The image display part 120 is disposed on the base substrate 110 and is not disposed on a connection base substrate 210.

The connection part 200 includes the connection base substrate 210. The connection part 200 does not include the base substrate 110 or the image display part 120.

The connection base substrate 210 is connected to the base substrate 110 and adjacent to the base substrate 110 in the first direction DR1. The connection base substrate 210 extends from the base substrate 110 along the first direction DR1. The connection base substrate 210 may be integrally formed with the base substrate 110. For example, the connection base substrate 210 and the base substrate 110 may be formed as one substrate. The connection base substrate 210 is connected to the grip part 400.

Figure 3C:
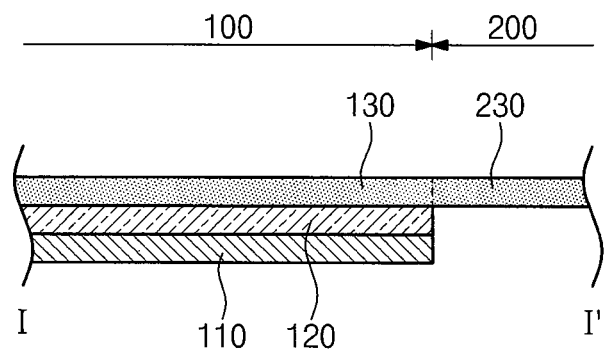

Referring to FIGS. 1A, 1B, and 3C, the flexible display panel 100 may further include a polarization film 130 disposed on the image display part 120. The polarization film 130 prevents an external light from being reflected and improves a side visibility of the image.

The flexible display panel 100 includes the base substrate 110, the image display part 120, and the polarization film 130. The image display part 120 is disposed on the base substrate 110. The polarization film 130 is disposed on the image display part 120.

The connection part 200 includes a connection polarization film 230. The connection part 200 does not include the base substrate 110 or the image display part 120.

The connection polarization film 230 is disposed adjacent to the polarization film 130 in the first direction DR1 and is connected to the polarization film 130. The connection polarization film 230 extends from the polarization film 130 along the first direction DR1. The connection polarization film 230 may be integrally formed with the polarization film 130. For example, the connection polarization film 230 and the polarization film 130 may be formed as one film. The connection polarization film 230 is connected to the grip part 400.

Figure 3D:
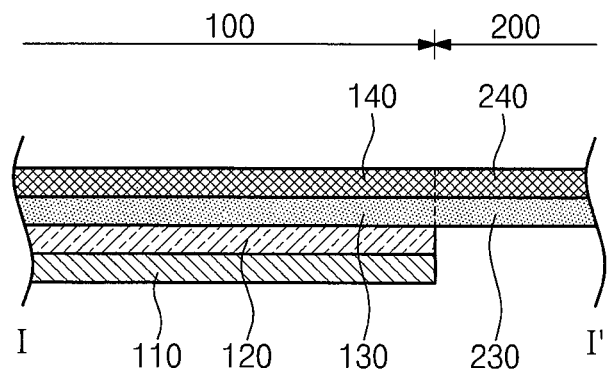

Referring to FIGS. 1A, 1B, and 3D, the flexible display panel 100 further includes an upper protective film 140 disposed on the polarization film 130. The upper protective film 140 protects the flexible display panel 100 from external impacts. The upper protective film 140 is formed of a transparent material with high transmittance.

The upper protective film 140 includes at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

The flexible display panel 100 includes the base substrate 110, the image display part 120, the polarization film 130, and the upper protective film 140. The image display part 120 is disposed on the base substrate 110, the polarization film 130 is disposed on the image display part 120, and the upper protective film 140 is disposed on the polarization film 130.

The connection part 200 includes the connection polarization film 230 and a connection upper protective film 240. The connection part 200 does not include the base substrate 110 or the image display part 120. The connection upper protective film 240 is disposed on the connection polarization film 230.

The connection upper protective film 240 is disposed adjacent to the upper protective film 140 in the first direction DR1 and connected to the upper protective film 140. The connection upper protective film 240 extends from the upper protective film 140 along the first direction DR1. The connection upper protective film 240 may be integrally formed with the upper protective film 140. For instance, the connection upper protective film 240 and the upper protective film 140 are formed through the same single process. The connection polarization film 230 and the connection upper protective film 240 are connected to the grip part 400.

Figure 3E:
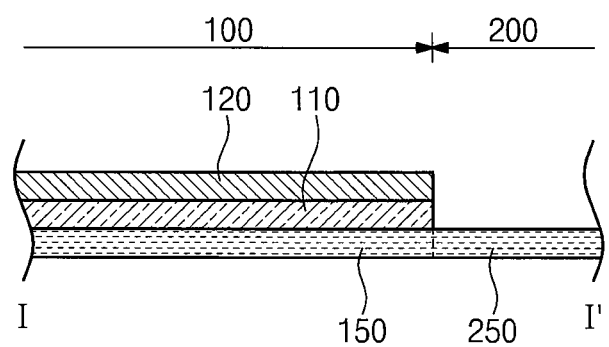

Referring to FIGS. 1A, 1B, and 3E, the flexible display panel 100 may further include a lower protective film 150 disposed under the base substrate 110. The lower protective film 150 protects the flexible display panel 100 from external impacts. The lower protective film 150 is formed of a transparent material with high transmittance.

The lower protective film 150 includes at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

The flexible display panel 100 includes the lower protective film 150, the base substrate 110, and the image display part 120. The base substrate 110 is disposed on the lower protective film 150 and the image display part 120 is disposed on the base substrate 110.

The connection part 200 includes a connection lower protective film 250. The connection part 200 does not include the base substrate 110 or the image display part 120.

The connection lower protective film 250 is disposed adjacent to the lower protective film 150 in the first direction DR1 and connected to the lower protective film 150. The connection lower protective film 250 extends from the lower protective film 150 along the first direction DR1. The connection lower protective film 250 may be integrally formed with the lower protective film 150. For instance, the connection lower protective film 250 and the lower protective film 150 are formed through the same single process as one film. The connection lower protective film 250 is connected to the grip part 400.

Figure 4A:
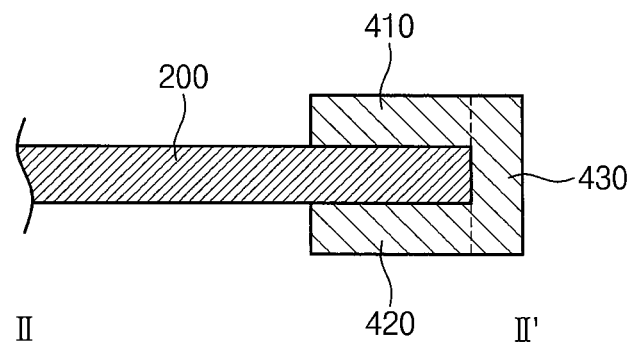
FIGS. 4A and 4B are cross-sectional views take along a line II-II' of FIG. 1B.
Figure 4B:
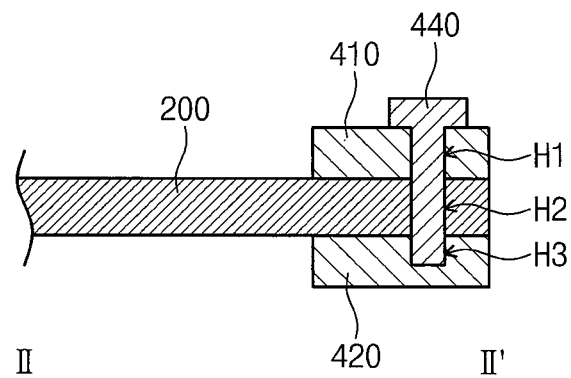

FIGS. 4A and 4B are cross-sectional views take along a line II-II' of FIG. 1.

Referring to FIGS. 1A, 1B, 4A, and 4B, when the external force is applied to the grip part 400 to pull the grip part 400, the flexible display panel 100 is exposed to the outside of the housing 300.

The grip part 400 includes an upper grip part 410 and a lower grip part 420. The upper grip part 410 is disposed on the connection part 200 and overlapped (or stacked in the second direction DR2) with at least a portion of the connection part 200. The lower grip part 420 is disposed under the connection part 200 and overlapped (or stacked in the second direction DR2) with at least a portion of the connection part 200. As shown in FIGS. 4A and 4B, one end of the connection part 200, one end of the upper grip part 410, and one end of the lower grip part 420 may be aligned with each other, but are not limited thereto. For example, at least one of the one end of the connection part 200, one end of the upper grip part 410, and one end of the lower grip part 420 may be offset (i.e., may be not aligned) relative to each other.

Referring to FIG. 4A, the grip part 400 further includes a side grip part 430. The side grip part 430 covers a side surface of the connection part 200 and is connected to the upper and lower grip parts 410 and 420.

Referring to FIG. 4B, the rollable display device 10 may further include a fixing screw 440. The fixing screw 440 connects the upper and lower grip parts 410 and 420 to fix the upper and lower grip parts 410 and 420 to each other. The fixing screw 440 penetrates an upper thru-hole H1 formed through the upper grip part 410 and a connection thru-hole H2 formed through the connection part 200, and then the fixing screw 440 is engaged with a lower recess H3 formed in the lower grip part 420. Accordingly, the upper grip part 410, the connection part 200, and the lower grip part 420 may be fixed to each other, but are not limited thereto. For example, the lower grip part 420 may include a lower thru-hole formed through the lower grip part 420 and the fixing screw 440 may sequentially penetrate the upper thru-hole H1, the connection thru-hole H2, and the lower thru-hole to fix the upper grip part 410, the connection part 200, and the lower grip part 420 to each other.

The rollable display device 10 may further include a touch screen panel and a window member. The touch screen panel may be disposed on the image display part 120 and the window member may be disposed on the touch screen panel. The touch screen panel senses a position at which a touch event occurs and the window member protects the touch screen panel.

In a rollable display device that includes a flexible display panel (e.g., the flexible display panel 100 according to one or more embodiments of the present disclosure) but does not include the connection part 200, the flexible display panel having pixels is directly connected to a grip part (e.g., the grip part 400 according to one or more embodiments of the present disclosure). The pixels that are adjacent to the grip part and are bent by an applied external force may malfunction due to stress at the bending positions. For example, defects may occur in the malfunctioning pixels that have been exposed to stress. As a result, the image is not clearly displayed in the malfunctioning pixels and the display quality of the flexible display panel is deteriorated.

In the rollable display device 10 according to one or more embodiments of the present disclosure, the rollable display device 10 includes the flexible display panel 100 and the connection part 200, such that when the external force is applied to the grip part 400, bending occurs in the connection part 200, in which no image is displayed. Therefore, bending of the flexible display panel 100 having pixels may be minimized or prevented. Thus, the rollable display device 10 including the connection part 200 may prevent the pixels from bending and improve the display quality thereof.

Hereinafter, a method of manufacturing the rollable display device 10 is described.

FIG. 5 is a flowchart showing a method of manufacturing the rollable display device 10 according to one or more embodiments of the present disclosure.

Referring to FIGS. 1A, 1B, and 5, the manufacturing method of the rollable display device 10 includes a step S100 of preparing the flexible display panel 100 (that displays the image) and the connection part 200 that is connected to the flexible display panel 100 (that does not display the image), a step S200 of connecting the flexible display panel 100 and the housing 300, and a step S300 of connecting the connection part 200 and the grip part 400. The step S100 of preparing the flexible display panel 100 and the connection part 200, the step S200 of connecting the flexible display panel 100 and the housing 300, and the step S300 of connecting the connection part 200 and the grip part 400 may be performed sequentially, or may be performed in a different sequence. For example, the step S200 of connecting the flexible display panel 100 and the housing 300 and the step S300 of connecting the connection part 200 and the grip part 400 may be performed prior to the step S100 of preparing the flexible display panel 100 and the connection part 200.

In the step S100 of preparing the flexible display panel 100 and the connection part 200, the flexible display panel 100 displaying the image and the connection part 200 connected to the flexible display panel 100 are prepared. The connection part 200 does not display the image (i.e., is not configured to display the image). The connection part 200 is disposed between the flexible display panel 100 and the grip part 400 to connect the flexible display panel 100 and the grip part 400. The connection part 200 is disposed adjacent to the flexible display panel 100 in the first direction DR1 and connected to the flexible display panel 100.

The step S100 of preparing the flexible display panel 100 and the connection part 200 includes preparing the base substrate 110 and disposing the image display part 120, which displays the image, on the base substrate 110.

Figure 6A:
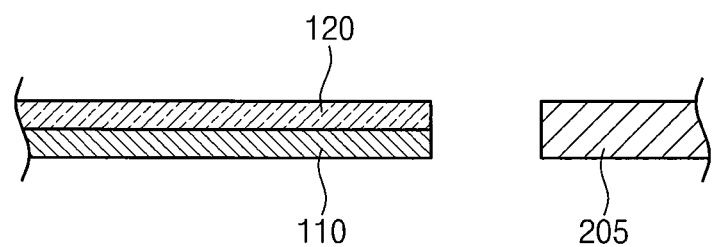
FIGS. 6A and 6B are cross-sectional views showing a portion of a manufacturing method of a rollable display device according to one or more embodiments of the present disclosure.
Figure 6B:
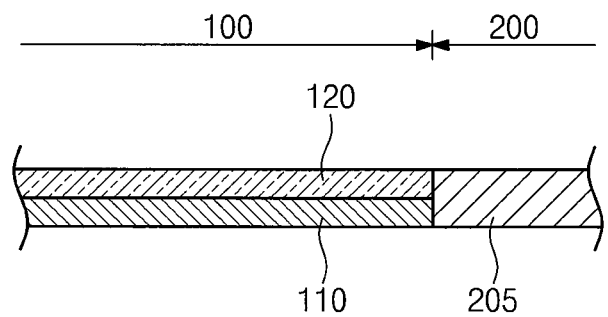

FIGS. 6A and 6B are cross-sectional views showing a portion of the manufacturing method of the rollable display device 10 according to one or more embodiments of the present disclosure.

Referring to FIGS. 1A, 1B, 5, and 6A, the step S100 of preparing the flexible display panel 100 and the connection part 200 includes preparing the connection film 205. The flexible display panel 100 includes the base substrate 110 and the image display part 120.

Referring to FIGS. 1A, 1B, 5, and 6B, the connection film 205 is attached to the base substrate 110 and the image display part 120 included in the flexible display panel 100. Although not shown in figures, the connection film 205 is connected to at least the portion of the base substrate 110 and the image display part 120 by the adhesive. The connection film 205 is connected to the grip part 400. The connection part 200 includes the connection film 205 and does not include the base substrate 110 or the image display part 120.

Figure 7A:
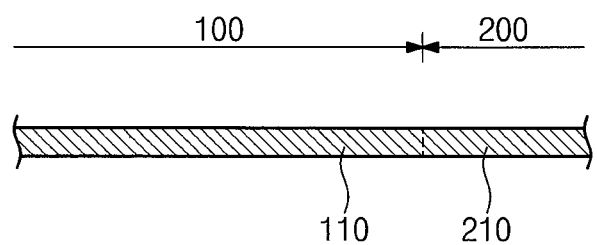
FIGS. 7A and 7B are cross-sectional views showing a portion of a manufacturing method of a rollable display device according to one or more embodiments of the present disclosure.
Figure 7B:
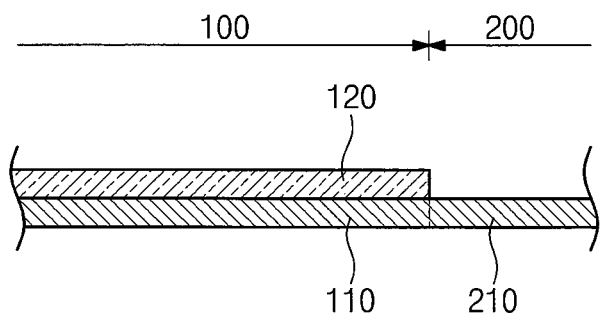
Figure 8A:
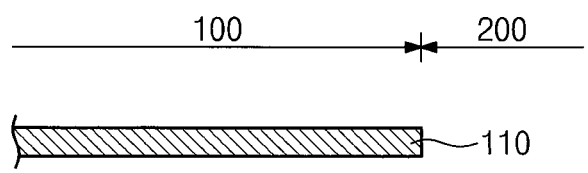
FIGS. 8A to 8D are cross-sectional views showing a portion of a manufacturing method of a rollable display device according to one or more embodiments of the present disclosure.
Figure 8B:
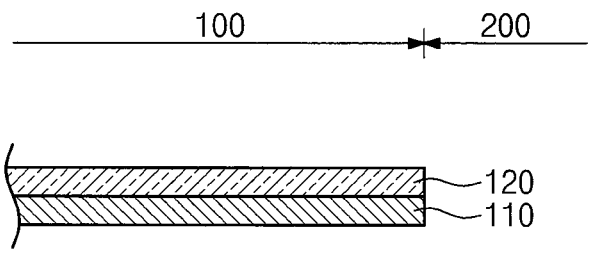
Figure 8C:
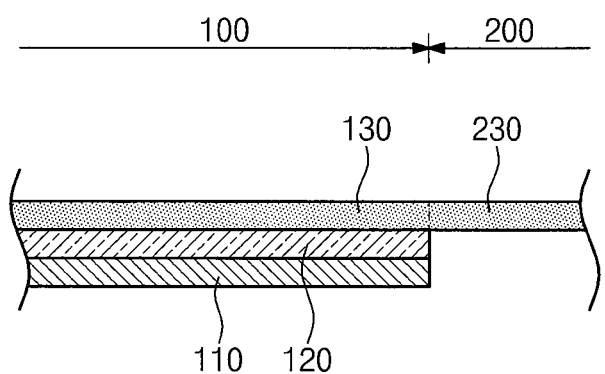
Figure 8D:
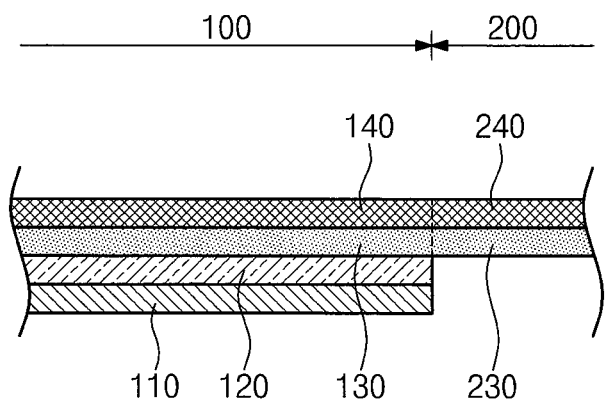

FIGS. 7A and 7B are cross-sectional views showing a portion of the manufacturing method of the rollable display device 10 according to one or more embodiments of the present disclosure.

The preparation of the base substrate 110 includes preparing the base substrate 110 and the connection base substrate 210 extending from the base substrate 110 along the first direction DR1. The step S300 of connecting the connection part 200 and the grip part 400 includes connecting the connection base substrate 210 and the grip part 400. The flexible display panel 100 includes the base substrate 110 and the image display part 120 and the connection part 200 includes the connection base substrate 210.

Referring to FIGS. 1A, 1B, 5, and 7A, the base substrate 110 and the connection base substrate 210 are prepared. The connection base substrate 210 is disposed adjacent to the base substrate 110 in the first direction DR1 and connected to the base substrate 110. The connection base substrate 210 extends from the base substrate 110 along the first direction DR1. The connection base substrate 210 and the base substrate 110 may be integrally formed. For example, the connection base substrate 210 and the base substrate 110 may be formed through a single process as one substrate.

Referring to FIGS. 1A, 1B, 5, and 7B, the image display part 120 is disposed on the base substrate 110. The image display part 120 is disposed on the base substrate 110 and is not disposed on the connection base substrate 210.

The flexible display panel 100 includes the base substrate 110 and the image display part 120. The image display part 120 is disposed on the base substrate 110 and is not disposed on the connection base substrate 210.

The connection part 200 includes the connection base substrate 210. The connection part 200 does not include the image display part 110. The connection base substrate 210 is connected to the grip part 400.

FIGS. 8A to 8D are cross-sectional views showing a portion of the manufacturing method of the rollable display device 10 according to one or more embodiments of the present disclosure.

Referring to FIGS. 1A, 1B, 5, and 8A to 8C, the step S100 of preparing the flexible display panel 100 and the connection part 200 further includes preparing the polarization film 130 and the connection polarization film 230 that extends from the polarization film 130 in the first direction DR1 and disposing the polarization film 130 on the image display part 120.

Referring to FIGS. 1A, 1B, 5, and 8A, the base substrate 110 is prepared. Referring to FIGS. 1A, 1B, 5, and 8B, the image display part 120 is disposed on the base substrate 110. Referring to FIGS. 1A, 1B, 5, and 8C, the polarization film 130 is disposed on the image display part 120.

The flexible display panel 100 includes the base substrate 110, the image display part 120, and the polarization film 130. The image display part 120 is disposed on the base substrate 110 and the polarization film 130 is disposed on the image display part 120.

The connection part 200 includes the connection polarization film 230. The connection part 200 does not include the base substrate 110 or the image display part 120. The connection polarization film 230 is connected to the grip part 400.

The connection polarization film 230 is disposed adjacent to the polarization film 130 in the first direction DR1 and connected to the polarization film 130. The connection polarization film 230 extends from the polarization film 130 in the first direction DR1. The connection polarization film 230 may be formed integrally with the polarization film 130. For example, the connection polarization film 230 and the polarization film 130 may be formed through the same process as one film. The connection polarization film 230 is connected to the grip part 400.

Referring to FIGS. 1A, 1B, 5, and 8A to 8D, the step S100 of preparing the flexible display panel 100 and the connection part 200 further includes preparing the upper protective film 140 and the connection upper protective film 240 that extends from the upper protective film 140 in the first direction DR1 and disposing the upper protective film 140 on the polarization film 130.

Referring to FIGS. 1A, 1B, 5, and 8A, the base substrate 110 is prepared. Referring to FIGS. 1A, 1B, 5, and 8B, the image display part 120 is disposed on the base substrate 110. Referring to FIGS. 1A, 1B, 5, and 8C, the polarization film 130 is disposed on the image display part 120. Referring to FIGS. 1A, 1B, 5, and 8D, the upper protective film 140 is disposed on the polarization film 130.

The flexible display panel 100 includes the base substrate 110, the image display part 120, the polarization film 130, and the upper protective film 140. The image display part 120 is disposed on the base substrate 110. The polarization film 130 is disposed on the image display part 120. The upper protective film 140 is disposed on the polarization film 130.

The connection part 200 includes the connection polarization film 230 and the connection upper protective film 240. The connection part 200 does not include the base substrate 110 or the image display part 120. The connection upper protective film 240 is disposed on the connection polarization film 230. The connection polarization film 230 and the connection upper protective film 240 are connected to the grip part 400.

The connection upper protective film 240 is disposed adjacent to the upper protective film 140 in the first direction DR1 and connected to the upper protective film 140. The connection upper protective film 240 extends from the upper protective film 140 in the first direction DR1. The connection upper protective film 240 may be integrally formed with the upper protective film 140. For example, the connection upper protective film 240 and the upper protective film 140 may be formed through the same process as one film. The connection polarization film 230 and the connection upper protective film 240 are connected to the grip part 400.

Figure 9A:
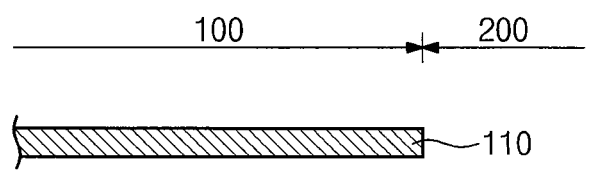
FIGS. 9A to 9C are cross-sectional views showing a portion of a manufacturing method of a rollable display device according to one or more embodiments of the present disclosure.
Figure 9B:
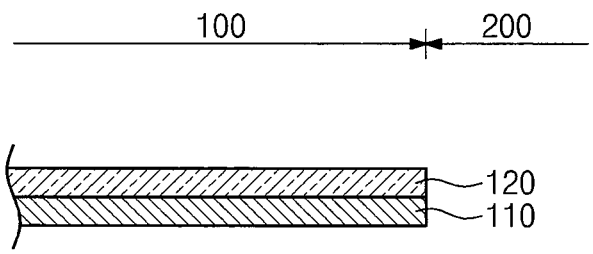
Figure 9C:
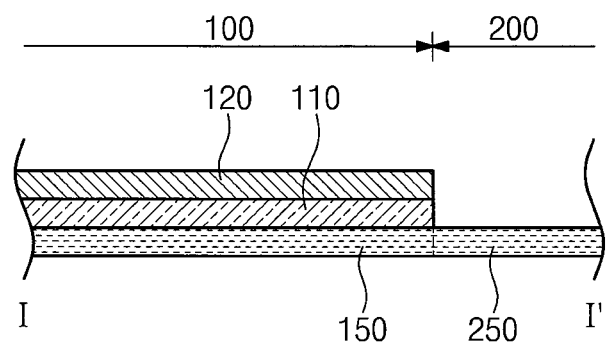

FIGS. 9A to 9C are cross-sectional views showing a portion of the manufacturing method of the rollable display device 10 according to an exemplary embodiment of the present disclosure.

Referring to FIGS. 1A, 1B, 5, and 9A to 9C, the step S100 of preparing the flexible display panel 100 and the connection part 200 further includes preparing the lower protective film 150 and the connection lower protective film 250 extending from the lower protective film 150 in the first direction DR1 and disposing the base substrate 110 on the lower protective film 150.

Referring to FIGS. 1A, 1B, 5, and 9A-9C, the base substrate 110 is prepared, then the image display part 120 is disposed on the base substrate 110, and then the base substrate 110 is disposed on the lower protective film 150, but this sequence is not limited thereto. For example, the image display part 120 may be disposed on the base substrate 110 after the base substrate 110 is disposed on the lower protective film 150.

The flexible display panel 100 includes the lower protective film 150, the base substrate 110, and the image display part 120. The base substrate 110 is disposed on the lower protective film 150. The image display part 120 is disposed on the base substrate 110.

The connection part 200 includes the connection lower protective film 250. The connection part 200 does not include the base substrate 110 and the image display part 120. The connection lower protective film 250 is connected to the grip part 400.

The connection lower protective film 250 is disposed adjacent to the lower protective film 150 in the first direction DR1 and connected to the lower protective film 150. The connection lower protective film 250 extends from the lower protective film 150 in the first direction DR1. The connection lower protective film 250 may be integrally formed with the lower protective film 150. For example, the connection lower protective film 250 and the lower protective film 150 may be formed through the same process as one film. The connection lower protective film 250 is connected to the grip part 400.

The manufacturing method of the rollable display device 10 according to the present exemplary embodiment may further include disposing the touch screen panel on the flexible display panel 100 and disposing the window member on the touch screen panel. The touch screen panel senses the position at which the touch event occurs and the window member protects the touch screen panel.

In a rollable display device that includes only a flexible display panel (e.g., the flexible display panel 100 according to one or more embodiments of the present disclosure) but does not include the connection part 200, the flexible display panel having pixels is directly connected to a grip part (e.g., the grip 400 according to one or more embodiments of the present disclosure). The pixels that are adjacent to the grip part may be bent by an applied external force and may malfunction due to stress applied at the bending locations. For example, defects may occur in the malfunctioning pixels that have been exposed to stress. As a result, the image is not clearly displayed in the malfunctioning pixels and the display quality of the flexible display panel is deteriorated.

In the rollable display device 10 according to one or more embodiments of the present disclosure, the rollable display device 10 includes the flexible display panel 100 and the connection part 200, such that when external force is applied to the grip part 400, bending occurs in the connection part 200, in which no image is displayed. Therefore, the bending which causes the defects in the pixels of the flexible display panel 100 may be prevented or minimized. Thus, the rollable display device 10 including the connection part 200 may prevent the pixels from bending and improve the display quality thereof.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A rollable display device comprising:
    a flexible display panel configured to display an image;
    a housing defining a flat opening and configured to contain the flexible display panel when the flexible display panel is rolled;
    a grip part configured to extend the flexible display panel from the housing upon application of an external force to expose the flexible display panel to an outside of the housing; and
    a connection part between the flexible display panel and the grip part connecting the flexible display panel and the grip part, wherein the connection part is not capable of displaying the image,
    wherein a first direction is an extensible direction of the flexible display panel, a second direction is a thickness direction of the flexible display panel, and a third direction is a direction perpendicular to each of the first and second directions, and
    wherein a width of the connection part in the third direction and a width of the flexible display panel in the third direction are the same.

2. The rollable display device of claim 1,
    wherein the flexible display panel is spaced from the grip part in a first direction and the flexible display panel comprises:

a base substrate; and an image display part on the base substrate and configured to display the image.

3. The rollable display device of claim 2, wherein the connection part comprises a connection film connected to at least a portion of the base substrate and the image display part.

4. The rollable display device of claim 3, wherein the connection film has a thickness equal to a sum of a thickness of the base substrate and a thickness of the image display part.

5. The rollable display device of claim 3, wherein at least one of the base substrate and the connection film comprises at least one of polycarbonate (PC), polyethyleneterephthalate (PET), polyethylene (PE), polypropylene (PP), polysulfone (PSF), polymethylmethacrylate (PMMA), triacetylcellulose (TAC), cycloolefin polymer (COP), and cycloolefin copolymer (COC).

6. The rollable display device of claim 2, wherein the connection part comprises a connection base substrate extending from the base substrate in the first direction.

7. The rollable display device of claim 2, wherein the flexible display panel further comprises a polarization film on the image display part and the connection part comprises a connection polarization film extending from the polarization film in the first direction.

8. The rollable display device of claim 7, wherein the flexible display panel further comprises an upper protective film on the polarization film and the connection part further comprises a connection upper protective film on the connection polarization film, the connection upper protective film extending from the upper protective film in the first direction.

9. The rollable display device of claim 2, wherein the flexible display panel further comprises a lower protective film under the base substrate and the connection part comprises a connection lower protective film extending from the lower protective film in the first direction.

10. The rollable display device of claim 1,
wherein the grip part comprises:
an upper grip part on the connection part and overlapped with at least a portion of the connection part; and
a lower grip part under the connection part and overlapped with at least a portion of the connection part.

11. The rollable display device of claim 10, wherein the grip part further comprises a side surface grip part that covers one side surface of the connection part and is connected to the upper grip part and the lower grip part.

12. The rollable display device of claim 10, further comprising a fixing screw,
wherein the fixing screw connects the upper grip part and the lower grip part and fixes the upper grip part to the lower grip part.

13. The rollable display device of claim 1, wherein a thickness of the connection part is different from a thickness of the flexible display panel.

14. The rollable display device of claim 1, wherein a thickness of the connection part is less than a thickness of the flexible display panel.

15. The rollable display device of claim 1, wherein a number of layers included in the connection part is less than a number of layers included in the flexible display panel.

16. A method of manufacturing a rollable display device comprising:
preparing a flexible display panel and a connection part connected to the flexible display panel, wherein the flexible display panel is configured to display an image and the connection part is not capable of displaying the image;
connecting the flexible display panel to a housing; and
connecting the connection part to a grip part.

17. The method of claim 16,
wherein the preparing of the flexible display panel and the connection part comprises:
preparing a base substrate; and
disposing an image display part on the base substrate, wherein the image display part is configured to display the image.

18. The method of claim 17,
wherein the preparing of the flexible display panel and the connection part comprises:
preparing a connection film; and
attaching the connection film to the base substrate and the image display part.

19. The method of claim 17,
wherein the preparing of the base substrate comprises preparing a base substrate and a connection base substrate extending from the base substrate in a first direction,
the connecting of the connection part and the grip part comprises connecting the connection base substrate to the grip part,
the flexible display panel comprises the base substrate and the image display part, and
the connection part comprises the connection base substrate.

20. The method of claim 17,
wherein the preparing of the flexible display panel and the connection part further comprises:
preparing a polarization film and a connection polarization film extending from the polarization film in a first direction; and
disposing the polarization film on the image display part,
wherein the connecting of the connection part to the grip part comprises connecting the connection polarization film to the grip part,
the flexible display panel comprises the base substrate, the image display part, and the polarization film, and
the connection part comprises the connection polarization film.

21. The method of claim 20,
wherein the preparing of the flexible display panel and the connection part further comprises:
preparing an upper protective film and a connection upper protective film extending from the upper protective film in a first direction; and
disposing the upper protective film on the polarization film,
wherein the connecting of the connection part to the grip part comprises connecting the connection upper protective film to the grip part, and
wherein the flexible display panel comprises the base substrate, the image display part, the polarization film, and the upper protective film, and the connection part comprises the connection polarization film and the connection upper protective film.

22. The method of claim 17,
wherein the preparing of the flexible display panel and the connection part further comprises:
preparing a lower protective film and a connection lower protective film extending from the lower protective film in a first direction; and
disposing the base substrate on the lower protective film, wherein the connecting of the connection part to the grip part comprises connecting the connection lower protective film to the grip part, wherein the flexible display panel comprises the lower protective film, the base substrate, and the image display part, and wherein the connection part comprises the connection lower protective film.

23. The method of claim 16, wherein a thickness of the connection part is different from a thickness of the flexible display panel.

24. The method of claim 16, wherein a thickness of the connection part is less than a thickness of the flexible display panel.

25. The method of claim 16, wherein a number of layers included in the connection part is less than a number of layers included in the flexible display panel.

26. A rollable display device comprising:

a flexible display panel comprising a display area configured to display an image and a non-display area not configured to display the image;

a housing defining a flat opening and configured to contain the flexible display panel when the flexible display panel is rolled;

a grip part configured to extend the flexible display panel from the housing upon application of an external force to expose the flexible display panel to an outside of the housing; and a connection part between the flexible display panel and the grip part to connect the flexible display panel and the grip part, wherein a first direction is an extensible direction of the flexible display panel, a second direction is a thickness direction of the flexible display panel, and a third direction is a direction perpendicular to each of the first and second directions, and wherein a width of the connection part in the third direction and a width of the flexible display panel in the third direction are the same.

27. The rollable display device of claim 26, wherein a thickness of the connection part is different from a thickness of the flexible display panel.

28. The rollable display device of claim 26, wherein a thickness of the connection part is less than a thickness of the flexible display panel.

29. The rollable display device of claim 26, wherein a number of layers included in the connection part is less than a number of layers included in the flexible display panel.

* * * * *